United States Patent [19]

Cheng

[11] Patent Number: 5,233,201

[45] Date of Patent: * Aug. 3, 1993

[54] SYSTEM FOR MEASURING RADII OF CURVATURES

[75] Inventor: David Cheng, Sunnyvale, Calif.

[73] Assignee: Ann Koo First American Building, San Jose, Calif.

[*] Notice: The portion of the term of this patent subsequent to Sep. 2, 2009 has been disclaimed.

[21] Appl. No.: 822,910

[22] Filed: Jan. 21, 1992

Related U.S. Application Data

[63] Continuation-in-part of Ser. No. 357,403, May 26, 1989, Pat. No. 5,118,955.

[51] Int. Cl.⁵ .............................................. G01V 9/04
[52] U.S. Cl. ..................................... 250/561; 356/376
[58] Field of Search ................ 250/560, 561; 356/371, 356/376

Primary Examiner—David C. Nelms
Assistant Examiner—Que T. Le
Attorney, Agent, or Firm—Burns, Doane, Swecker & Mathis

[57] ABSTRACT

A system for measuring topological features, such curvatures and profiles, of surfaces such as semiconductor wafer surfaces. The system includes a) laser means and lens means for directing a beam of weakly-convergent light for incidence on a surface which is to be measured, b) photodetector means for detecting the position of the laser light beam reflected from the surface, c) first translation means for providing relative movement between the laser means and the surface in a direction which is normal to the direction of the incident beam, so that the incident beam is caused to scan across the surface, e) position sensing means connected to the photodetector means for detecting the location on the photodetector means at which the reflected beam is incident.

18 Claims, 3 Drawing Sheets

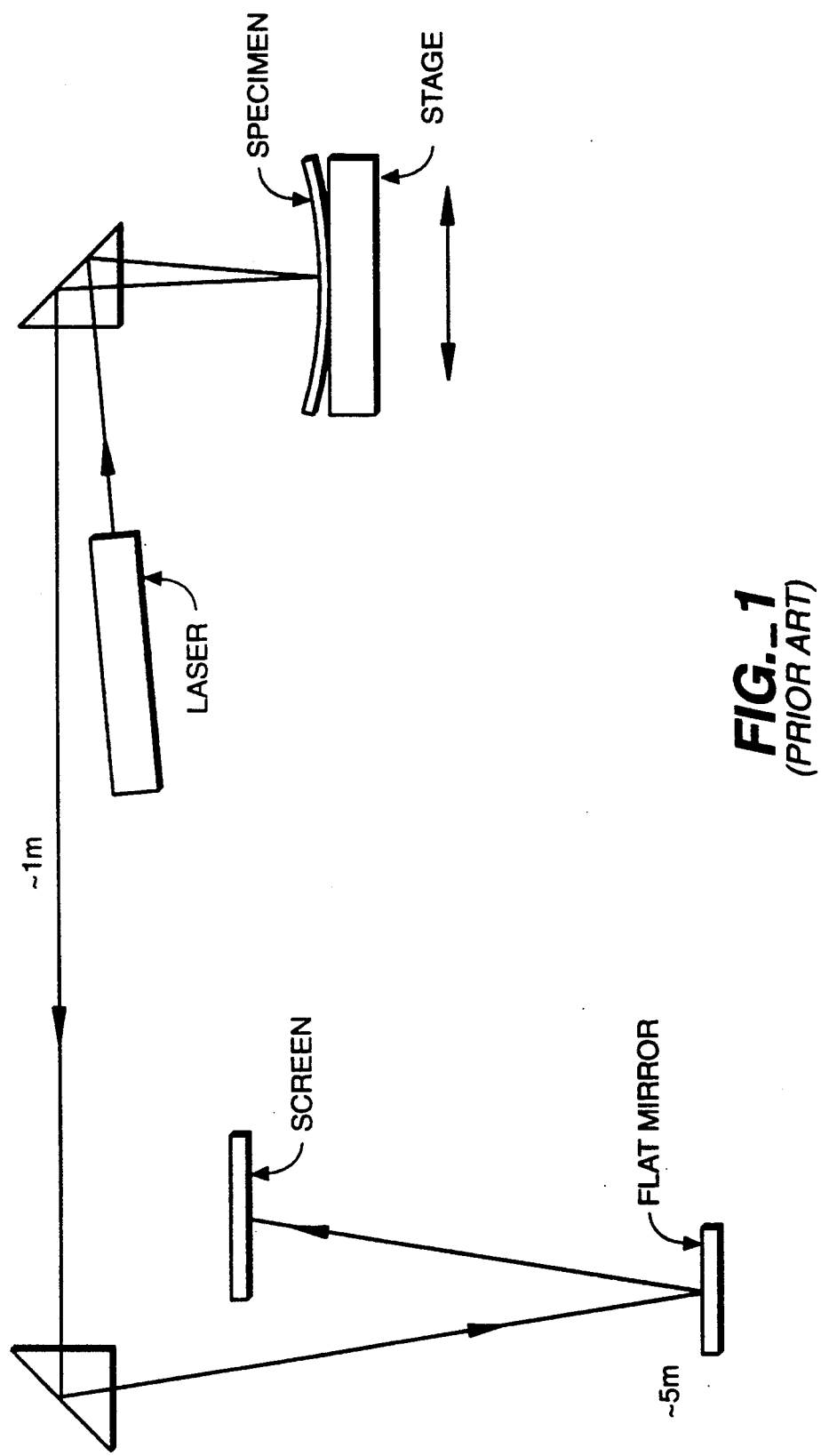
FIG._1
(PRIOR ART)

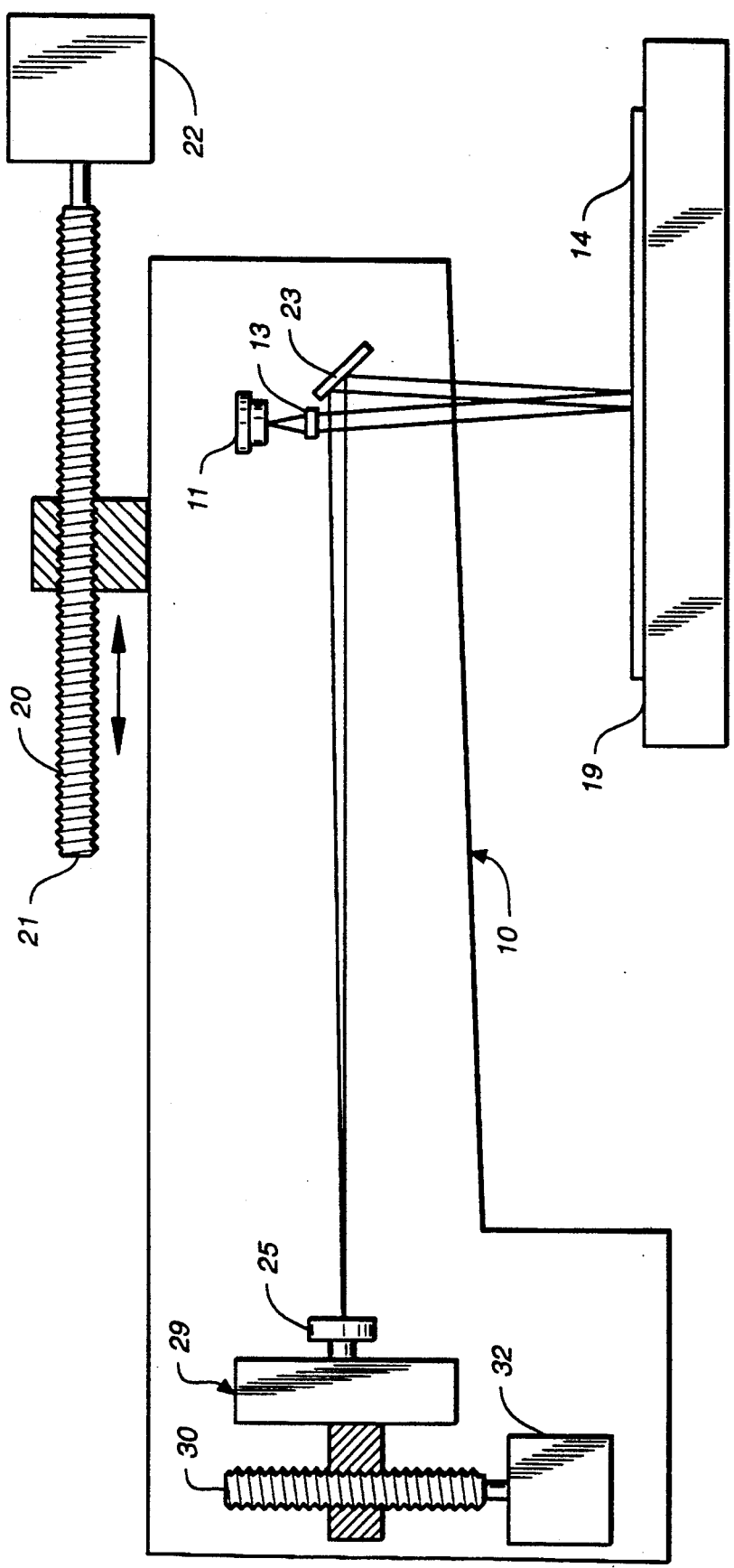
FIG._2

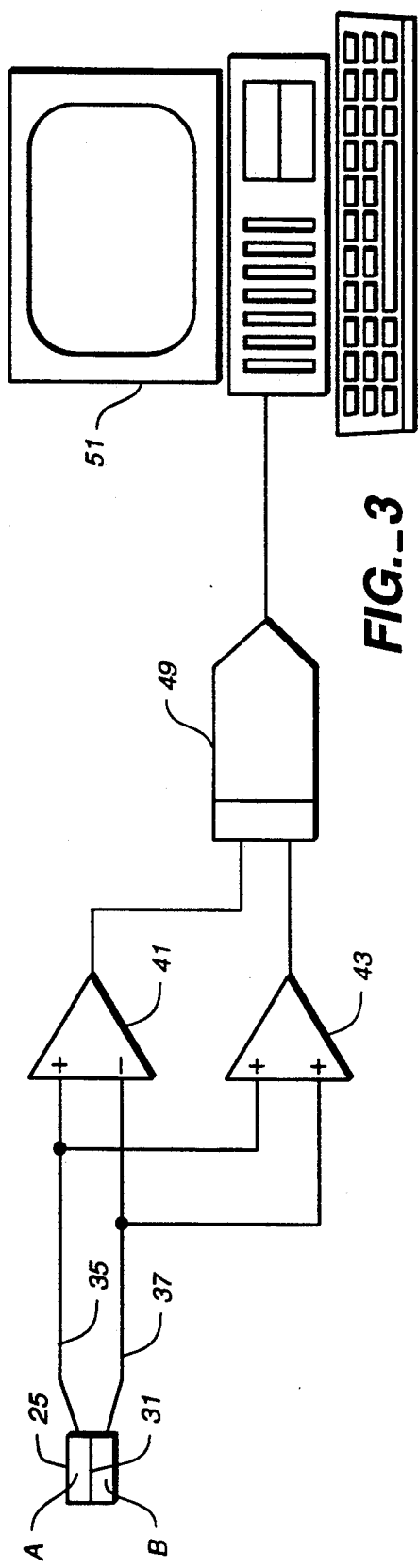
FIG._3
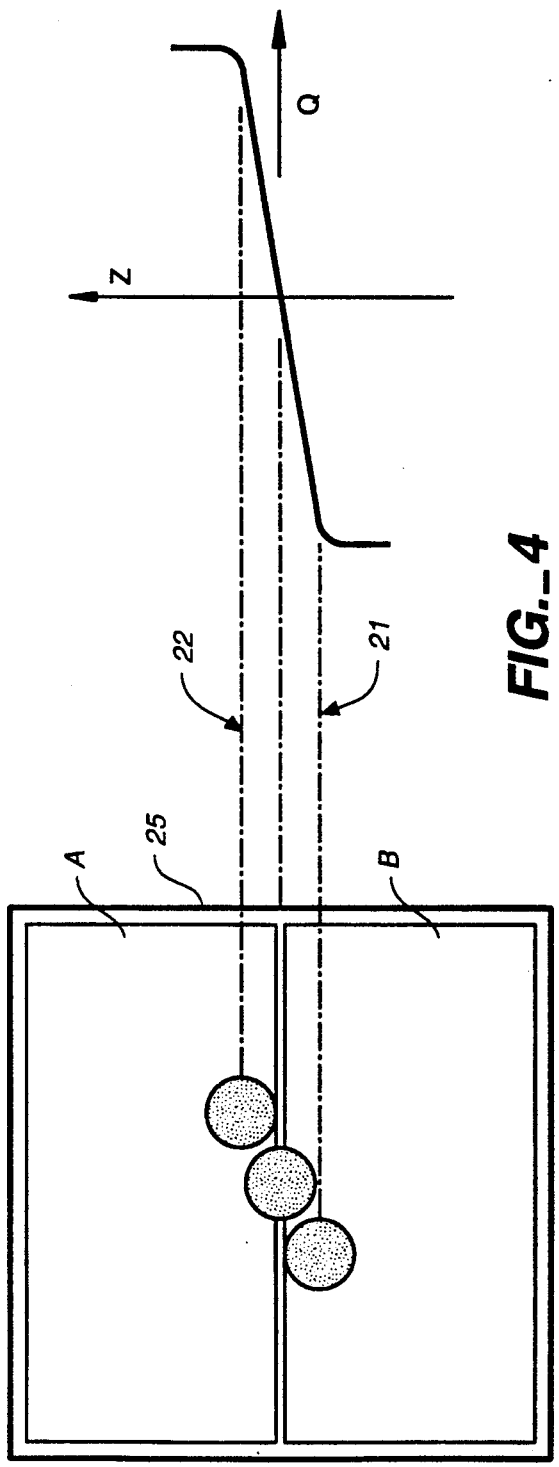
FIG._4

SYSTEM FOR MEASURING RADII OF CURVATURES

BACKGROUND OF THE INVENTION

1. Related Applications

The present application is a continuation-in-part of co-pending application Ser. No. 07/357,403 for FILM STRESS MEASUREMENT SYSTEM, filed May 26, 1989, now U.S. Pat. No. 5,118,955 and commonly assigned herewith, the disclosure of which is incorporated herein in its entirety.

2. Field of the Invention

The present invention generally relates to systems that measure film stresses and, more particularly, to systems that measure topological features, such curvatures and profiles, of surfaces of semiconductor wafers.

3. State of the Art

During the manufacture of semiconductor wafers, it is conventional practice to form one or more thin film layers on the surface of a single semiconductor wafer to serve as a substrate for integrated circuits. The surface films can comprise, for example, silicon dioxide, AlSi, Ti, TiN, PECVD oxide, PECVD oxynitride, doped glasses, comprise, for example, silicon dioxide, AlSi, Ti, TiN, PECVD oxide, PECVD oxynitride, doped glasses, silicides, and so forth. The thickness of such films typically ranges from about 500 to about 12,000 Angstroms.

When manufacturing semiconductor integrated circuits, it is important to have minimal stresses in surface films on the underlying substrates. The surface stresses can cause, for instance, silicide lifting, the formation of voids and cracks, and other conditions that adversely affect integrated circuit semiconductor devices that are fabricated on the wafers. The surface stresses are especially problematical in large-scale integration and very large-scale circuit integrations.

Stress in surface films on semiconductor wafers can be characterized as either of the compressive or tensile type. Both stress types can cause slight curvatures in the surface of a semiconductor wafer—that is, the stresses can cause the surface of a semiconductor wafer to deviate from exact planarity. Typically, the extent of deviation is quantified in terms of the surface's radius of curvature. Generally speaking, the greater the magnitude of the surface stress, the smaller the radius of curvature; conversely, the smaller the stress, the greater the radius of curvature. In practice, the radius of curvature of a semiconductor wafer is often measured in kilometers—or even hundreds of kilometers—while the diameter of a semiconductor wafer is measured in inches, and the depths of the surface layer films are measured in microns.

Detection of stresses in surface films on semiconductor wafers is important in semiconductor fabrication operations. The measurements can be used, for example, to identify wafers that are likely to provide low yields. Also, the measurements can be used to identify wafers that are likely to produce failure-prone semiconductor devices.

As mentioned above, stresses in surface films are not measured directly but, instead, are inferred from measurements of the radius of curvature of the surface of interest. In mathematical terms, surface film stresses are often expressed by a function that includes Young's modulus for the silicon substrate portion of the wafer, the Poisson ratio for the substrate, the thickness of the substrate, the film thickness, and the radius of curvature of the wafer due to surface film stress. As a matter of convention, negative values of a radius of curvature indicate compressive stress and positive values indicate tensile stress.

FIG. 1 shows an example of a known system for making laboratory measurements of surface curvatures of semiconductor wafers. In the system, a beam of laser light is directed onto the surface of a semiconductor wafer and the reflected light is projected onto a screen. If the wafer surface has a radius of curvature, the location at which the reflected light strikes the screen will change as the wafer is moved perpendicularly to the beam. By measuring both the distance that a wafer is moved and the resulting distance that a beam of reflected light moves across the screen, the wafer's radius of curvature can be determined.

In mathematical terms, the radius of curvature (R) of a wafer can be related to measurements provided by the system of FIG. 1 as follows:

$$R = 2L(\delta x/\delta d) \qquad (1)$$

where $\delta x$ is the distance of translation of the wafer, $\delta d$ is the resulting translation of the spot formed by the reflected beam on the screen, and L is the distance traveled by the reflected beam. In the system shown, the beam travel distance is about ten meters (i.e., L=10 meters). These systems—often referred to as optically levered systems—are further described in *Thermal Stresses and Cracking Resistance of Dielectric Films on Si Substrates*, A. K. Sinha et. al., *Journal of Applied Physics* vol. 49, pp. 2423-2426, 1978. In practice, calibration of such systems is difficult and normally requires two or more standard reference surfaces.

SUMMARY OF THE INVENTION

Generally speaking, the present invention provides a self-calibrating system for measuring topological features, such as curvature and profiles of surface of semiconductor wafers. In the preferred embodiment of the present invention, the system includes a) laser means and lens means for directing a beam of light for incidence on a surface which is to be measured, b) photodetector means for detecting the position of the laser light beam reflected from the surface, c) first translation means for providing relative movement between the laser means and the semiconductor wafer in a direction which is normal to the direction of the incident beam, so that the incident beam is caused to scan across the surface, and e) position sensing means connected to the photodetector means for detecting the location on the photodetector means at which the reflected beam is incident.

BRIEF DESCRIPTION OF THE DRAWINGS

The present invention can be further understood by reference to the following description and attached drawings which illustrate the preferred embodiment of the invention. For purposes of clarity, identical parts are given the same reference numbers in the various drawing figures. In the drawings:

FIG. 1 is a schematic diagram of a system according to the prior art for making wafer surface curvature measurements;

FIG. 2 shows a surface curvature measurement system according to the present invention;

FIG. 3 is a schematic diagram of an electrical circuit for use with the measurement system of FIG. 2; and FIG. 4 is a diagram that illustrates operation of the system of FIG. 2.

DETAILED DESCRIPTION OF THE PREFERRED EMBODIMENTS

In FIG. 2, the measurement system includes a diode laser module 10 for measuring the surface curvature of a semiconductor wafer 14 which is fixed to a stationary stage 19. In practice, means are usually provided to heat the stage 19 to an elevated temperature (e.g., more than one hundred degrees centigrade.) The heating means typically comprises an electrical heater in the nature of a hot plate.

As further shown in FIG. 2, a laser diode 11 is located in the module 10 for emitting light through a collection and refocussing lens 13. In the system, the lens 13 directs the weakly focused (convergent) light toward the surface of the wafer 14. The module 10 also includes a mirror 23 for reflecting light from the convergent beam as it is reflected from the wafer surface. Still further, the module includes a photodetector 25 for detecting the position of the beam of light that has been reflected by mirror 23.

In practice, the beam path length for the system of FIG. 2 is about three-hundred millimeters. That is, the distance from the mirror 23 to the detector 25 is about three-hundred millimeters.

As further shown in FIG. 2, the module 10 is mounted on a first translating mechanism 20 that selectively translates the module back and forth, as indicated by the arrows, in a direction parallel to the wafer surface. Preferably, the translating mechanism 20 includes a lead screw 21 and a stepper motor 22 that advances, or retracts, the lead screw in reproducible small increments. The increments typically are about 0.6 microns. In practice, the first translating mechanism 20 is mounted to move the module 10 across a diameter of the semiconductor wafer.

Referring still to FIG. 2, it will be observed that the photodetector 25 is mounted to a second translating mechanism, generally designated by the number 29, carried by the module 10. The second translating mechanism 29 moves (i.e., translates) the photodetector in a direction perpendicular to the direction of the reflected beam. For instance, where the path of the reflected light coincides with the x-direction, the translating mechanism 29 moves photodetector 25 the z-direction (i.e., upward or downward). Preferably, the translating mechanism includes a screw member 30 which is rotated by a stepper motor 32 so that the screw member 30 moves the photodetector in discrete, reproducible increments. Typically, the increments are about 0.6 microns.

FIG. 3 shows circuitry for sensing displacement of the beam of reflected light. In the illustrated embodiment, the circuitry includes a conventional photodetector 25, such as a silicon PIN diode, having a bifurcated light-receiving surface. The bifurcation can be accomplished by, for example, constructing the photodetector of two separate PIN diodes with the detection signals separately available from each of the diodes. For purposes of discussion, the portion of photodetector 25 on one side of line 31 is designated by the letter A, and the portion of the detector on the other side of the line is designated by the letter B. A conductor 35 provides output electrical signals from detector portion A and, similarly, a conductor 37 provides electrical output signals from detector portion B.

In operation of photodetector 25 of FIG. 3, output signals are provided on conductor 35 if the reflected beam is incident on detector portion A. Likewise, electrical signals are provided on conductor 37 if the reflected beam is incident on detector portion B. The output signals are provided from both detectors A and B if the spot of the reflected beam strikes (i.e., overlaps) line 31. The electrical output signals on conductors 35 and 37 are analog signals in that sense that their amplitudes vary with the intensity of the reflected beam and the size of the spot projected onto the detectors.

Further in the circuit of FIG. 3, conductor 35 is connected to the positive input of a differential-voltage operational amplifier 41, and conductor 37 is connected to the negative input of the amplifier. Also, conductors 35 and 37 are separately connected to the inputs of a summing amplifier 43. Output signals from the amplifiers 41 and 43 are provided to a computer interface circuit 49 consisting primarily of an analog-to-digital converter. The converter converts the analog signal values to digital values that are provided to a conventional microprocessor-based digital computer 51 for storage. The stored digital values can be manipulated, as by algorithms that are described below, to provide measurements of the radius of curvature of a surface such as the surface of a semiconductor wafer.

Operation of the circuit of FIG. 3 can be further understood by reference to FIG. 4, wherein the graph depicts the function:

$$diff = A - B. \tag{2}$$

In equation (2), the letter A represents the signal amplitude on conductor 35 (i.e., the magnitude of the signal from detector A within photodetector 25), and the letter B represents the signal amplitude on conductor 37 (i.e., the magnitude of the signal from detector B). In other words, equation (2) represents the output of operational amplifier 41.

Further for purposes of discussion of the operation of the system of FIG. 3, it can be assumed that the reflected beam initially strikes only detector A within photodetector 25. Also to simplify the discussion, it can be assumed that amplifier 41 has unity gain. Under those assumptions, the value of the function of equation (2) equals the magnitude of signal A (i.e., diff=A). On the other hand, if the reflected beam strikes only detector B within photodetector 25, the value of the function will equal the negative of the magnitude of signal B (i.e., diff=−B ). Both situations are shown graphically in FIG. 4.

In situations where the reflected beam simultaneously strikes detectors A and B in the circuit of FIG. 3, the value of equation (2) will equal the quantity A-B, where the magnitudes of signals A and B are proportional to the cross-sectional area of the beam spot which strikes detectors A and B, respectively, as the beam spans line 31. In other words, the output of operational amplifier 41 in such circumstances equals the magnitude of signal A minus the magnitude of signal B. It should be noted that the magnitude of the amplifier output decreases generally monotonically as the beam spot traverses line 31 from detector A to detector B.

It should be understood that the summing amplifier 43 in FIG. 3 can be used for normalizing the output of the differential amplifier 41. More particularly, the output of differential amplifier 41 can be divided by the output of summing amplifier 43 to provide the following function, Q:

$$Q=(A-B)/(A+B). \tag{3}$$

Although the division operation could be implemented by hardware (i.e., by a divider circuit), but is more conveniently implemented in software within computer 51. As a result of such a normalization operation, measurements provided by the system of FIG. 2 can be made insensitive to beam intensity, to changes in the reflectivity from the wafer surface, to signal drift and other environmental factors.

For calculations based upon information provided by the system of FIG. 2, the measurement region of interest is usually only a portion (e.g., ten percent) of the region bounded by lines z1 and z2 in FIG. 4. Within that region, the amplitude of the quantity $(A-B)$ changes generally linearly with changes in displacement in the z-direction. In practice, the approximation to linearity is most exact for a limited range of values about the point where the signal amplitude function intersects the z axis. As will be further discussed below, this linear relationship allows the radius of curvature of a semiconductor wafer to be measured with high accuracy but in a simple manner.

In operation of the above-described system, the first translation means is stationary while the laser diode 11 and its associated components are selectively translated in a direction which is normal to the direction of the incident beam, thereby causing the incident beam to scan across the wafer surface. As this occurs, displacement of the beam spot is monitored. Then, the magnitude of the function Q is detected to provide a measure of the change in the value of Q as a function of relative displacements between stage 29 and the reflected beam. In other words, knowledge of changes in function Q enables a function $\delta Q/\delta Z$ to be calculated. In turn, calculation of the function $\delta Q/\delta Z$ allows the measurement system to be calibrated since the function $\delta Q/\delta Z$ identifies the change in the output of the circuit of FIG. 3 resulting from a change in the position of the reflected laser beam. Thus, the above-described system is self-calibrating in the sense that external standards are not required.

While the laser diode 11 and its associated components are selectively translated in a direction which is normal to the direction of the incident beam, the surface curvature measurements are made. If there is any curvature to the surface of a specimen, the curvature causes a change in the location at which the reflected beam strikes photodetector 25 and, in turn, will cause changes in the system output signal (e.g., function Q). The change in location at which the reflected beam strikes photodetector 25 can be computed as described, for example, in co-pending application Ser. No. 07/357,403. Also as described in the co-pending application, measurements obtained by the system of FIG. 2 can be operated upon by statistical techniques to enhance the accuracy of the measurements. Particularly, it is often helpful to perform a least-squares fit analysis of measurements at a number of locations across a wafer.

In practice, the above-described measurement system can provide measurements of surface stress to resolutions better than about $5 \times 10^6$ dynes per square centimeter for wafers with film thicknesses of about one micrometer.

The foregoing has described the principles, preferred embodiments and modes of operation of the present invention. However, the invention should not be construed as limited to the particular embodiments discussed. For example, the system of the present invention is not limited to measuring the topology of semiconductor wafers, but can be used to measure surface curvatures of magnetic disks (such as are used for the magnetic recording of binary data in microprocessor-based computers), optical disks and other substrates. The measurements may be used, for instance, to detect disks that have relatively high surface curvatures and, hence, are likely to experience surface layer peeling or cracking. As another example, as described in co-pending application Ser. No. 07/357,403, the wafer stage 19 can be moved under the control, for instance, of a lead screw driven by a stepper motor.

Thus, it should be understood that the above-described embodiments ar to be regarded as illustrative rather than restrictive, and that variations may be made in those embodiments by workers skilled in the art without departing from the scope of present invention as defined by the following claims.

What is claimed is:

1. A system for making topological measurements, such as surface curvature measurements of a semiconductor wafer, comprising:
   a) laser means and lens means for directing a beam of convergent but unfocussed light for incidence on the surface to be measured;
   b) photodetector means for detecting the position of the laser light beam reflected from the surface;
   c) first translation means for providing relative movement between the laser means and the measured surface in a direction which is normal to the direction of the incident beam, so that the incident beam is caused to scan across the surface; and
   d) position sensing means connected to the photodetector means for detecting the location on the photodetector means at which the reflected beam is incident.

2. A system according to claim 1 further including a second translation means for selectively moving the photodetector means in a direction which is normal to the direction of the reflected beam.

3. A system according to claim 2 further including calculating means for calculating the curvature of the measured surface based upon measurements of changes in position due to operation of the first and second translation means.

4. A system according to claim 3 wherein the calculating means is connected to the position sensing means for computing the displacement of the reflected beam on the photodetector means relative to changes in position of the first and second translation means.

5. A system according to claim 1 wherein the photodetector means includes first and second photodetectors for separately providing output signals that indicate the position of the reflected beam.

6. A system according to claim 5 further including an operational amplifier connected for subtracting signals provided by a first photodetector from signals provided by a second photodetector.

7. A system according to claim 6 further including analog-to-digital converter means connected for converting the outputs of the first and second photodetectors to digital signals for computational use by the calculating means for calculating the curvature of the surface of the semiconductor wafer.

8. A system according to claim 7 wherein the calculating means calculates the radius of curvature, R, of the wafer surface in accordance with the following equation:

$$R = 2L(\delta x/\delta z)$$

where $\delta x$ is the distance of translation of the wafer, $\delta z$ is the resulting translation of the spot formed by the reflected beam, and L is the distance travelled by the beam.

9. A system according to claim 8 wherein the calculating means calculates stresses for a multiplicity of locations on the wafer surface.

10. A system according to claim 1 further including heating means for heating the measured surface.

11. A system according to claim 1 wherein the heating means for heating the measured surface comprises an electrical heating element.

12. A method for measuring the curvature of a surface with an optically levered system, comprising the steps of:
  a) directing a convergent but unfocussed beam of convergent light onto a surface whose curvature is to be measured;
  b) with first and second photodetectors, receiving light reflected from the surface;
  c) selectively moving the converging beam relative to the surface; and
  d) then, detecting the displacement of the reflected light relative to the first and second photodetectors.

13. The method according to claim 12 further including the step of computing the radius of curvature of the reflecting surface based upon the detected displacement.

14. The method according to claim 12 further including the step of computing stress on the reflecting surface as a function of the computed radius of curvature.

15. The method according to claim 14 further including the step of scanning across the reflecting surface and, for a large number of discrete locations along the scan, computing radii of curvature for the surface, and then computing the mean value of the computed radii.

16. The method according to claim 12 wherein the relative movement is accomplished by a first translation means that provides relative movement between a laser means and a measured surface in a direction which is normal to the direction of the incident beam, so that the incident beam is caused to scan across the surface.

17. The method according to claim 12 further including the step of heating the measured surface.

18. The method according to claim 17 wherein the heating step is accomplished by an electrical heating element that heats the measured surface.

* * * * *